(12) United States Patent
Tsuji et al.

(10) Patent No.: US 10,509,522 B2
(45) Date of Patent: Dec. 17, 2019

(54) CAPACITIVE TOUCH SWITCH

(71) Applicants: NORITAKE CO., LIMITED, Aichi (JP); NORITAKE ITRON CORPORATION, Mie (JP)

(72) Inventors: Hitoshi Tsuji, Mie (JP); Isamu Kanda, Mie (JP); Tadami Maeda, Mie (JP); Kouichi Okuyama, Mie (JP); Misa Yamanaka, Mie (JP)

(73) Assignees: NORITAKE CO., LIMITED, Aichi (JP); NORITAKE ITRON CORPORATION, Mie (JP)

( * ) Notice: Subject to any disclaimer, the term of this patent is extended or adjusted under 35 U.S.C. 154(b) by 0 days.

(21) Appl. No.: 16/061,336

(22) PCT Filed: Dec. 9, 2016

(86) PCT No.: PCT/JP2016/086666
§ 371 (c)(1),
(2) Date: Jun. 11, 2018

(87) PCT Pub. No.: WO2017/099208
PCT Pub. Date: Jun. 15, 2017

(65) Prior Publication Data
US 2019/0042025 A1  Feb. 7, 2019

(30) Foreign Application Priority Data

Dec. 11, 2015 (JP) .................. 2015-241709

(51) Int. Cl.
*G06F 3/044* (2006.01)
*H03K 17/96* (2006.01)

(52) U.S. Cl.
CPC ........... *G06F 3/044* (2013.01); *H03K 17/962* (2013.01); *H03K 2217/96066* (2013.01); *H03K 2217/960765* (2013.01)

(58) Field of Classification Search
CPC ....... G06F 3/041; G06F 3/044; H03K 17/962; H03K 17/955; H05K 1/0296; H05K 1/118; H01H 36/00
See application file for complete search history.

(56) References Cited

U.S. PATENT DOCUMENTS

| 2015/0193066 | A1  | 7/2015 | Su |
|---|---|---|---|
| 2016/0018348 | A1* | 1/2016 | Yau .......................... G06F 3/044 324/697 |
| 2016/0253029 | A1  | 9/2016 | Maeda |

FOREIGN PATENT DOCUMENTS

| CN | 203350852 U | 12/2013 |
|---|---|---|
| CN | 104571754 A | 4/2015 |

(Continued)

OTHER PUBLICATIONS

International Search Report for PCT/JP2016/086666 dated Mar. 7, 2017.

(Continued)

*Primary Examiner* — Sardis F Azongha
(74) *Attorney, Agent, or Firm* — Hedman & Costigan, P.C.; James V. Costigan; Kathleen A. Costigan

(57) ABSTRACT

To provide a capacitive touch switch capable of improving ununiformity of design and improving appearance relating to design or decorativeness. A capacitive touch switch 1 includes a glass substrate 2, a sensor portion formed at a side of an opposite surface opposite to a touch surface of the glass substrate. The sensor portion includes a center portion A of a wire attached portion 4 to a flexible printed circuit, and a connection portion C connected to the wire network B. In the connection portion C, an opening rate in a capacitive touch switch panel is increased by setting an electrode pattern width to be thinner from the wire attached portion A toward the wire network B.

4 Claims, 8 Drawing Sheets

(56) References Cited

FOREIGN PATENT DOCUMENTS

| CN | 204288198 U | 4/2015 |
|---|---|---|
| CN | 104685453 A | 6/2015 |
| CN | 104765481 A | 7/2015 |
| CN | 104915048 A | 9/2015 |
| CN | 105045452 A | 11/2015 |
| CN | 105659350 A | 6/2016 |
| JP | 2010-191504 A | 9/2010 |
| JP | 2011-175412 A | 9/2011 |
| JP | 2013-077555 A | 4/2013 |
| JP | 2014-120290 A | 6/2014 |
| JP | 2014-160558 A | 9/2014 |
| WO | 2015/053062 A1 | 4/2015 |
| WO | 2015/083410 A1 | 6/2015 |
| WO | 2015/137477 A1 | 9/2015 |

OTHER PUBLICATIONS

International Preliminary Report on Patentability dated Jun. 12, 2018.
English Abstract for JP 2013-077555 A dated Apr. 25, 2013.
English Abstract for JP 2014-160558 A dated Sep. 4, 2014.
English Abstract for CN 105659350 A dated Jun. 8, 2016.
English Abstract for JP 2014-120290 A dated Jun. 30, 2014.
English Abstract for JP 2010-191504 A dated Sep. 2, 2010.
English Abstract for CN 104765481 A dated Jul. 8, 2015.
English Abstract for JP 2011-175412 A dated Sep. 8, 2011.
English Abstract for CN 203350852 U dated Dec. 18, 2013.
English Abstract for CN 204288198 U dated Apr. 22, 2015.
English Abstract for CN 104915048 A dated Sep. 16, 2015.
English Abstract for CN 105045452 A dated Nov. 11, 2015.
English Abstract for CN 104685453 A dated Jun. 3, 2015.
English Abstract for CN 104571754 A dated Apr. 29, 2015.

* cited by examiner

CAPACITIVE TOUCH SWITCH

TECHNICAL FIELD

The present invention relates to a capacitive touch switch, in particular relates to a capacitive touch switch in which a visibility is improved.

BACKGROUND ART

In household electrical appliances, audio visual appliances, personal computer equipment, office automation equipment, industrial machines or other electronic devices, a capacitive touch switch is used as one of input devices to each appliance.

FIG. 8 shows one example of the capacitive touch switch. FIG. 8 is a cross-sectional side view of the touch switch. In a capacitive touch switch 1', a switch design 2a' is formed on a glass cover 2' by means of printing or laser trimming, and further a sensor electrode 3' is arranged. Further, a control portion 10 and the touch switch 1' are connected via flexible printed circuits (hereinafter, referred to as FPC) 4'. In the capacitive touch switch having such a configuration, when a surface of the cover 2' is touched by a finger, electrostatic coupling is generated between the sensor electrode 3' and the finger, and thereby capacitance of the electrode is changed. The sensor electrode 3' is arranged at a plurality of positions corresponding to the switch design. A wire is assigned to each sensor electrode 3', and each sensor electrode 3' and the control portion 10 are connected by the wire and the FPC 4'. In the control portion 10, a change amount of the capacitance of the sensor electrode 3' is converted into numerals, and when the numeral exceeds a predetermined threshold, it is determined that the finger is contacted. With this, in the control portion 10, it can be detected that the capacitance of which sensor electrode 3' is changed, and therefore it can be detected that which touch switch portion is touched by the finger.

Further, as a touch switch, a capacitive touch switch provided with a glass substrate, a sensor portion formed at a side of an opposite surface opposite to a touch surface of the glass substrate, and a cover glass arranged at a side of the surface in which the sensor portion is arranged. The sensor portion includes a sensor electrode formed of metal thin film formed at a side of the opposite surface opposite to the touch surface of the glass substrate. The glass substrate and the cover glass are glass-sealed. The sensor portion is arranged in the glass-sealed space. An external connection terminal connected to the sensor portion and extended from the glass-sealed space toward an outside is arranged (see Patent Document 1).

As a touch switch having less number of components and good appearance, a touch switch provided with a sensor portion formed by a plurality of switch electrodes formed on a substrate and a switch electrode wire connected to the switch electrodes, a dummy electrode arranged around the sensor portion is known. The switch electrode is provided with a flat surface pattern and a design part in the flat surface pattern. Each of the sensor portion and the dummy electrode is formed of metal thin film (see Patent Document 2).

As a capacitive switch capable of suppressing that a gap between a transparent electrode and a non-transparent electrode is seen and capable of improving quality of design and decorativeness, a capacitive switch in which a plurality of the transparent electrodes is aligned by applying etching and laser processing to a silver nanowire painted on a film base material so as to form the gap between the transparent electrode and the non-transparent electrode, and a plurality of wire lines connected to the transparent electrode is formed by drying and curing silver ink at an edge portion on one surface of the film base material, and a protection layer is formed as an adhesive tape excluding acrylic acid, is known (see Patent Document 3).

PRIOR ART DOCUMENTS

Patent Documents

Patent Document WO 2015/053062 A
Patent Document 2: JP 2013-077555 A
Patent Document 3: JP 2014-160558 A

SUMMARY OF THE INVENTION

Problems to be Solved by the Invention

However, the dummy electrode is necessary in Patent Document 2, and the silver nanowire is used in Patent Document 3. Thus, both techniques cause an increase in cost, and therefore it is difficult to use those techniques industrially. Further, the improvement of the appearance of a touch switch screen is not sufficient due to the presence of the dummy electrode or the silver nanowire.

In particular, in a case in which an FPC attached portion and a wire attached portion connected to the sensor electrode are arranged adjacent to each other, ununiformity of the design becomes conspicuous, and therefore the improvement of the appearance of the design or the decorativeness might be difficult.

FIG. 7 is a view illustrating a conventional technique in which an FPC attached portion and a lead wire attached portion are arranged adjacent to each other.

In a capacitive touch switch having a sensor portion, a FPC attached portion 4 and an aluminum (hereinafter, referred to as Al) wire 5 arranged on a rear surface of the capacitive touch switch, an Al wire width A1 of 300 µm or more is normally required in a center portion A of the FPC attached portion 4. On the other hand, in a wire network B from a lead wire attached portion, in order to make the wire inconspicuous, a wire width B1 is normally set to 10 µm or less and a wire pitch B2 is normally set to 300 µm or more. A line/space (A1/A2) in the Al wire layer in the center portion A of the FPC attached portion 4 is 300 µm/10 µm, while a line/space (B1/B2) in the Al wire layer in the wire network B from the lead wire attached portion is 10 µm/300 µm. Thus, an outline of the center portion A of the FPC attached portion 4 becomes distinct, and therefore ununiformity of the design cannot be improved.

An object of the present invention is, in order to solve such a problem, to provide a capacitive touch switch including a sensor electrode portion, an FPC attached portion, and a wire network that connects the sensor electrode portion and the FPC attached portion to each other, the FPC attached portion and the wire network arranged adjacently, the capacitive touch switch being capable of improving ununiformity of design and improving appearance relating to design or decorativeness.

Means for Solving the Problem

A capacitive touch switch of the present invention includes a glass substrate, a sensor portion formed at a side of an opposite surface opposite to a surface to be touched of the glass substrate, an FPC wire attached portion, and a wire network that connects the sensor portion and the FPC wire attached portion. The FPC wire attached portion includes a connection portion connected to the wire network. The connection portion is formed by a predetermined electrode pattern such that an opening rate is increased by setting a width of the electrode pattern to be thinner gradually from the FPC wire attached portion toward the wire network.

Further, in the capacitive touch switch of the present invention, the opening ratio of the connection portion may be increased concentrically toward an outer side with respect to the FPC wire attached portion defined as a center region. Further, color of the electrode pattern may be set to be the same as a background color.

Effect of the Invention

In the capacitive touch switch of the present invention, as the electrode pattern width of the connection portion becomes thinner gradually from the FPC wire attached portion toward the wire network, the opening rate in the capacitive touch switch becomes larger. Accordingly, the opening rate of the FPC wire attached portion becomes gradually closer to the opening rate of the glass substrate. Consequently, ununiformity of design can be improved, and appearance relating to design or decorativeness can be improved.

MODE FOR CARRYING OUT THE INVENTION

Figure 1:
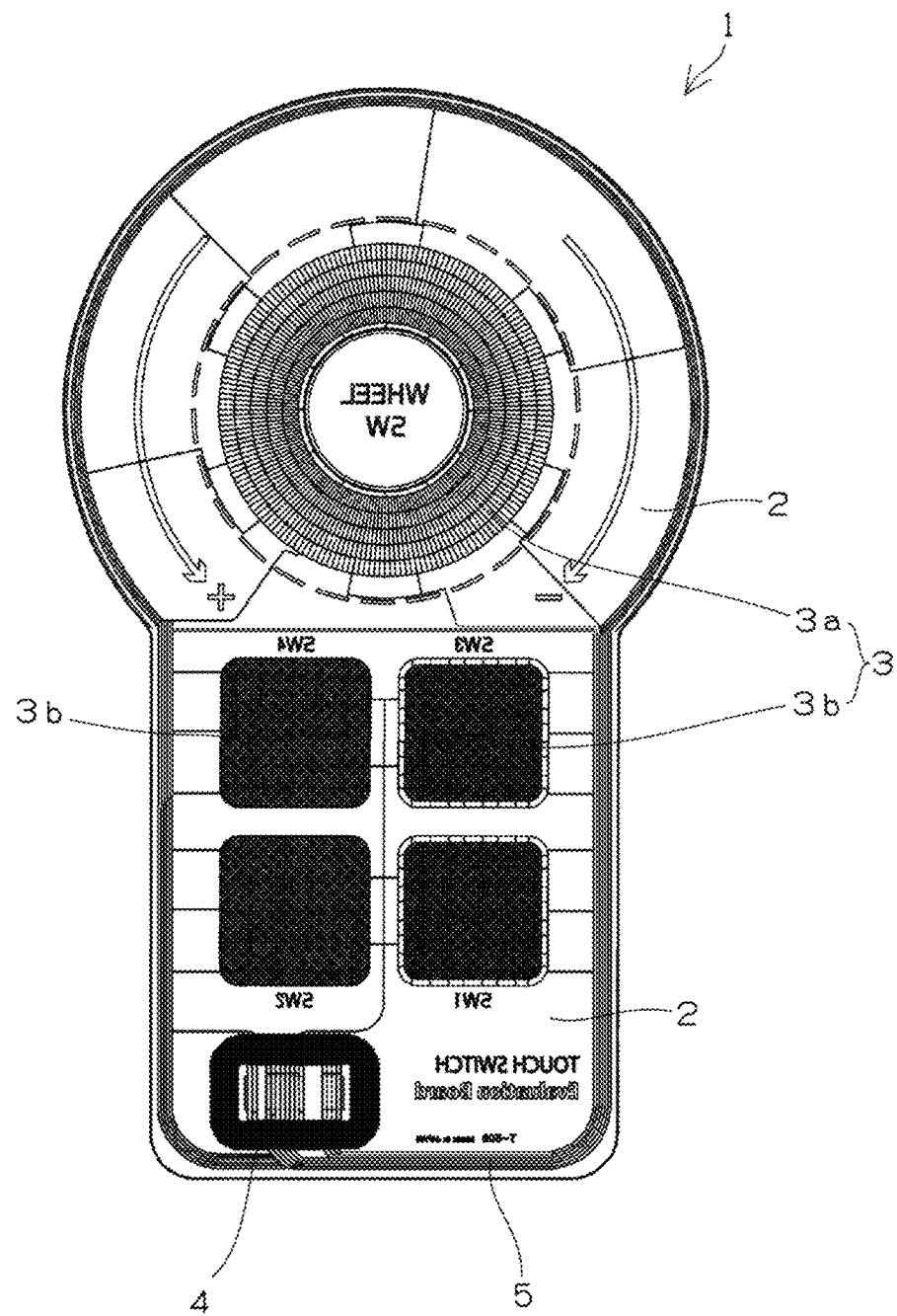
FIG. 1 is view illustrating a capacitive touch switch wire seen from a surface opposite to a touch surface.

A capacitive touch switch of the present invention is described with reference to FIG. 1. FIG. 1 is a wire view seen from a surface opposite to a touch surface of the capacitive touch switch.

A capacitive touch switch 1 is provided with a sensor portion 3 arranged on a surface opposite to a touch surface of a glass substrate 2 an FPC wire attached portion 4, and a wire 5 that connects the sensor portion 3 and the FPC wire attached portion 4 to each other. The sensor portion 3 is provided with a wheel switch 3a, a touch switch 3b and the like. The wire 5 is shown on a surface of the touch surface so as to surround the sensor portion 3 and the FPC wire attached portion 4.

Figure 2:
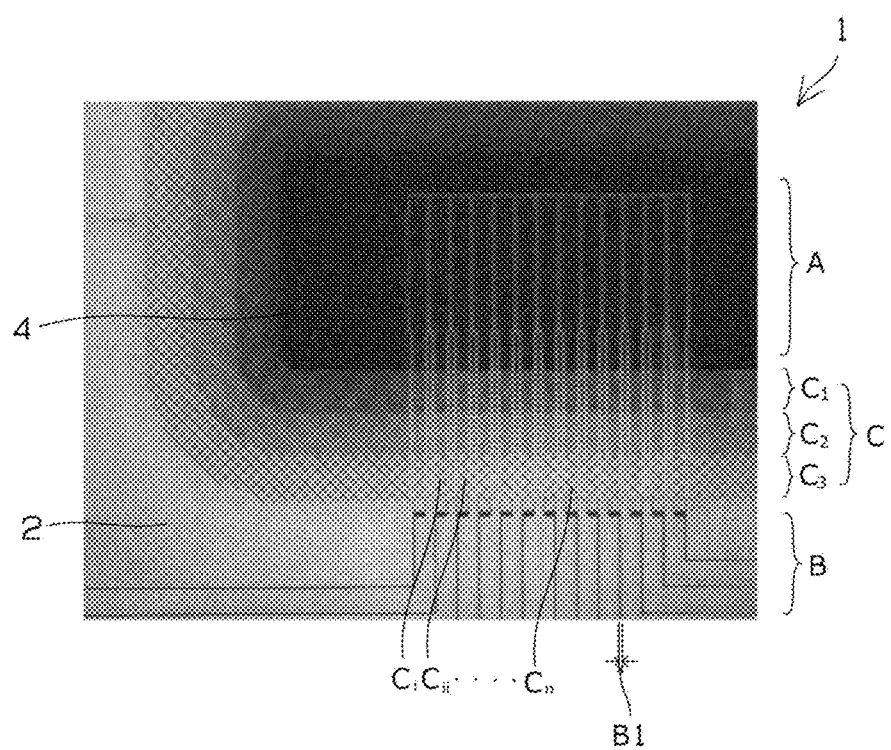
FIG. 2 is a view illustrating a relation between an attached portion A, a wire network B, and a connection portion C.
Figure 3:
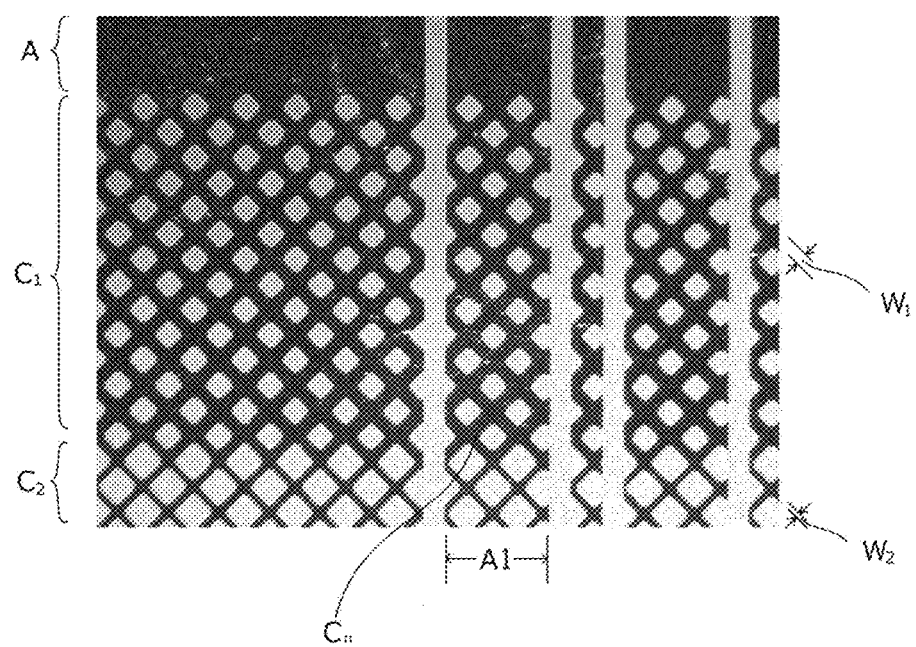
FIG. 3 is an enlarged view of a part of the connection portion C adjacent to the attached portion A.
Figure 4:
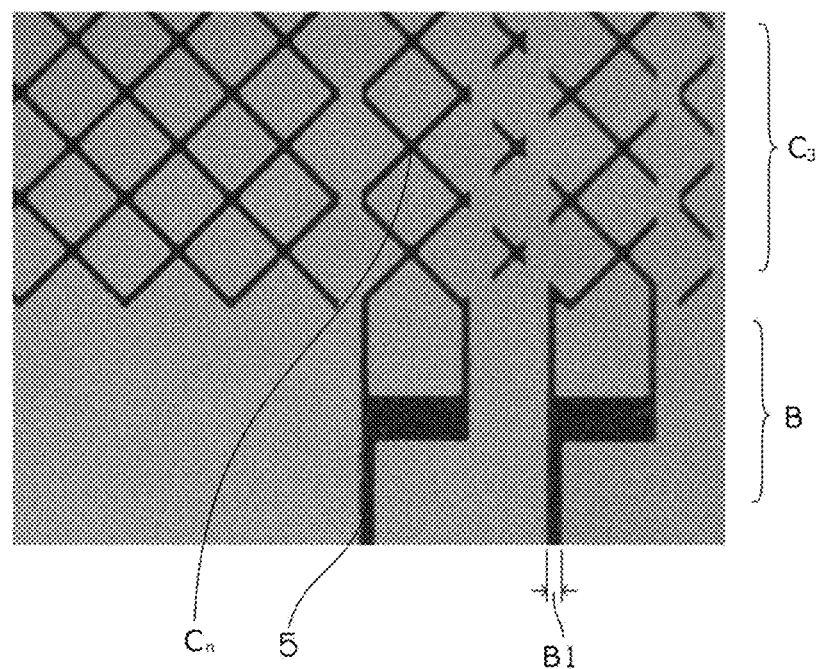
FIG. 4 is an enlarged view of a part of the connection portion C adjacent to the wire network B.

FIGS. 2 through 4 are enlarged views illustrating the FPC wire attached portion 4 and around thereof. FIG. 2 is a general view illustrating a relation between a center portion A, a wire network B, and a connection portion C of the FPC wire attached portion 4. FIG. 3 is an enlarged view of a part of the connection portion C adjacent to the center portion A.

FIG. 4 is an enlarged view of a part of the connection portion C adjacent to the wire network B.

As shown in FIG. 2, the connection portion C is provided with a connection portion $C_1$, a connection portion $C_2$, and a connection portion $C_3$ in which an opening rate is increased gradually from the center portion A toward the wire network B of the FPC wire attached portion 4. The connection portion C is formed as a lattice-shaped electrode, and lead wires $C_i$, $C_{ii}$, . . . , $C_n$ are independent from each other.

As shown in FIG. 3, in the wire $C_n$ from the center portion A of the wire attached portion 4 having a wire width A1, a lattice-shaped electrode pattern width $W_2$ in the connection portion $C_2$ is smaller than a lattice-shaped electrode pattern width $W_1$ in the connection portion $C_1$, and thereby the opening rate of a $C_2$-region is larger than that of a $C_1$-region. For example, by setting the opening rate of the $C_1$-region to 25%, the opening rate of the $C_2$-region to 50%, and the opening rate of a $C_3$-region (see FIGS. 2 and 4) to 75%, an outline of the center portion A of the wire attached portion 4 becomes indistinct, and thereby quality of design is improved.

As shown in FIG. 2, in the connection portion C, the opening rate is increased from the center portion A toward an outer side of the wire attached portion 4 concentrically. That is, the lattice-shaped electrode pattern width W is set to be narrow from the lattice-shaped electrode pattern width $W_1$ to the lattice-shaped electrode pattern width $W_2$. Thus, an outline of a whole region of the wire attached portion 4 is made inconspicuous, and thereby quality of design of a display surface is improved.

As shown in FIG. 4, the wire network B to the wire 5 is formed such that the wire 5 and the lead wire $C_n$ are connected to each other in a region $C_3$ in which the opening rate of the connection portion C becomes the maximum. Further, the FPC wire attached portion 4 and the sensor portion 3 are connected by the wire 5. Thus, even if a line width B1 in the wire network B is made thin, an outline against the center portion of the FPC wire attached portion 4 is not made distinct.

Figure 5:
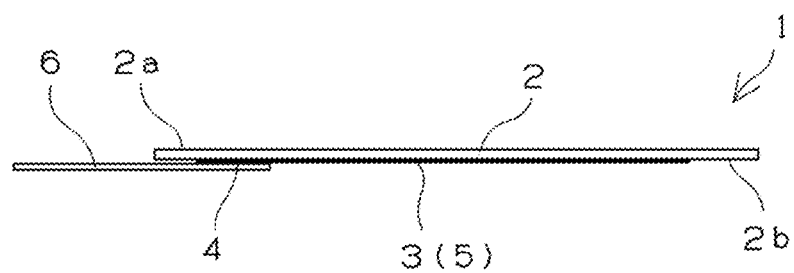
FIG. 5 is a side view of a capacitive touch sensor.

FIG. 5 is a side view of the capacitive touch switch. As shown in FIG. 5, the capacitive touch switch 1 is provided with the light translucent glass substrate 2, the sensor portion 3 and the wire 5 formed on the glass substrate 2. A surface of the glass substrate 2 is served as a touch surface 2a. The sensor portion 3 is arranged on an opposite surface 2b of the touch surface 2a. The sensor portion 3 is connected to the FPC wire attached portion 4 by the wire 5 so as to be connected to a control portion (not shown) by the lead wire 6. In this figure, a protection layer or a light diffusion layer is not arranged in the sensor portion 3, however the protection layer or the light diffusion layer may be arranged as needed.

Examples of the protection layer include a coating film formed by thick-film printing and baking paste of glass having low melting point, and a coating film formed by thick-film printing and drying paste of organic resin. By arranging the protection layer, deterioration of the switch electrode can be prevented. Further, the protection layer can be colored by adding color pigment into each paste, and thereby when the protection layer is seen from a space between the switch electrodes, the switch design is multi-colored. Further, in the sensor portion 3, the light diffusion layer may be arranged at a space between the sensor electrodes at a side of the surface of the glass substrate on which the Al thin film is formed, or at a position of a light translucent portion (opening of the protection layer or the like) formed on the sensor electrode. Light from an illumination light source can be diffused by the light diffusion layer, and therefore even if the illumination light source is small, brightness in a light emitting portion on the touch surface can be made uniform. Example of the light diffusion layer includes a coating film formed by applying frit glass having a low melting point or resin paste into which glass beads (particle diameter of 4 μm to 60 μm) is dispersed and by baking the frit glass having a low melting point or by drying the resin paste.

Figure 6:
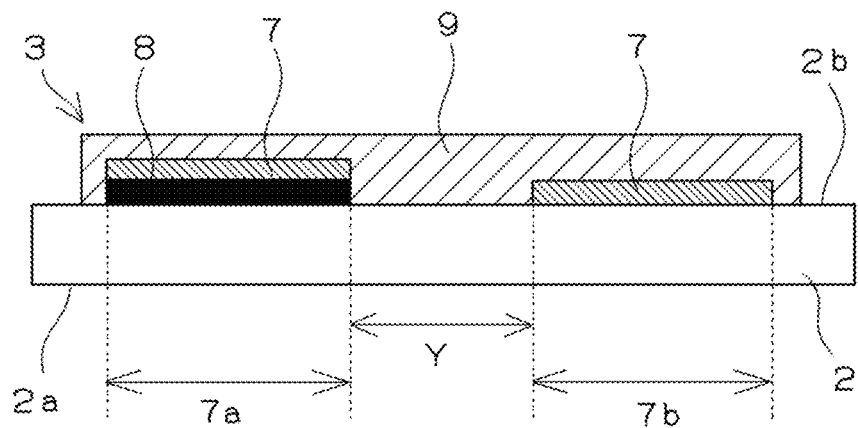
FIG. 6 is an enlarged schematic cross-sectional view of a sensor portion.
Figure 7:
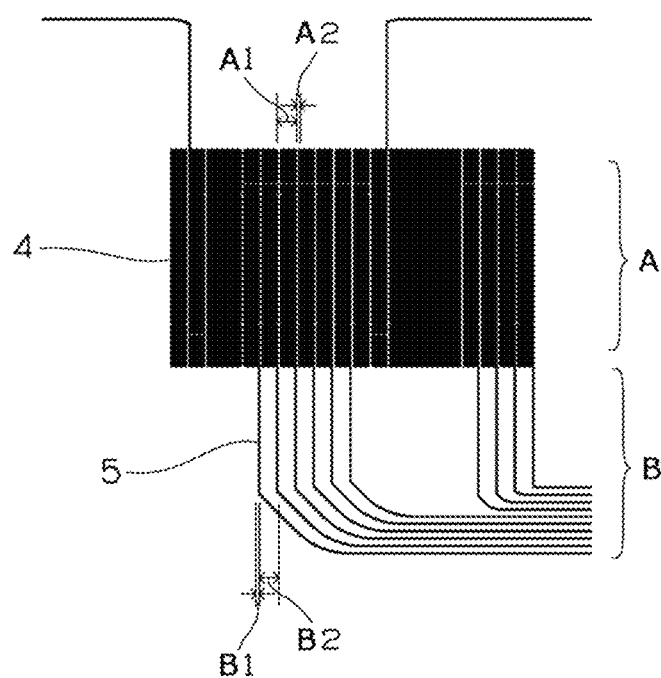
FIG. 7 is a view illustrating a state in which an FPC attached portion and a lead wire attached portion are arranged adjacent to each other.
Figure 8:
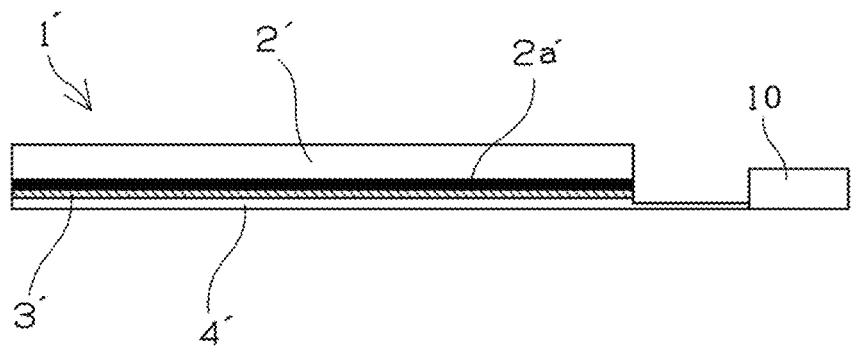
FIG. 8 is a side view illustrating a conventional capacitive switch panel.

FIG. 6 shows an enlarged schematic cross-sectional view of the sensor portion 3. As shown in FIG. 6, an intermediate layer 8 is formed between the switch electrode 7 formed of Al thin film and the glass substrate 2 at a region of a switch 7a. The intermediate layer 8 is formed as a black film formed by inserting a thin film including at least one of Cr, Mo, and W, for example an oxide layer of Mo—Al, having a certain thickness. The intermediate layer 8 absorbs incident light by interference of visible light, so that the layer appears black (black layer). The region of the switch 7a appears black, a region of a switch 7b appears gloss silver, and a region Y appears color of the protection layer 9 (for example, black), when seen from the touch surface 2a. In a case in which the present invention is applied to a black touch switch having such a black Al wire layer, the color of the electrode pattern is the same as a background color on a display surface, and thereby the quality of the design is further improved effectively.

The glass substrate 2 is a light translucent insulation substrate formed of soda lime glass, quartz glass, borosilicate glass, or alkali free glass not including alkali component. The soda lime glass is preferable because of its high translucency and extremely low in cost as used in a window glass of a general building material. Further, a thickness of the glass substrate 2 is set in a range between 0.5 mm and 5 mm, preferably in a range between 1.8 mm and 3.0 mm.

The switch electrode 7 of the sensor portion 3 is formed by a conductive film and formed on the opposite surface 2b of the touch surface 2a of the glass substrate 2. Examples of the conductive film include metal thin film, conductive inorganic thin film formed of tin oxide or ITO, and vanadate based, bismuth based, or lead based conductive low melting point glass. Examples of the metal thin film include metal thin film formed by a thin film forming method, and metal thin film formed of metal foil such as copper foil and gold foil.

The metal thin film formed by the thin film forming method is formed by a known thin film forming method using material such as Al, Al alloy, niobium, molybdenum, gold, silver, and copper. Of these metal thin films, the Al thin film is preferable because of its excellent environmental resistance and low in cost.

INDUSTRIAL APPLICABILITY

The capacitive touch switch of the present invention can improve the quality of the design of the touch switch because the FPC connection portion is inconspicuous due to gradation treatment of a periphery of the FPC wire attached portion on the display surface. Accordingly, the capacitive touch switch of the present invention can be preferably used as an input device harmonized with each device in general household electrical appliances, audio visual appliances, personal computer equipment, office automation equipment, industrial machines or other electronic device.

REFERENCE SIGNS LIST

1: capacitive touch switch
2: glass substrate
3: sensor portion
4: wire attached portion
5: wire
6: lead wire
7: switch electrode
8: intermediate layer
9: protection layer
10: control portion

The invention claimed is:

1. A capacitive touch switch comprising:
a glass substrate;
a sensor portion formed at a side of an opposite surface opposite to a surface to be touched of the glass substrate;
a wire attached portion of a flexible printed circuit; and
a wire network that connects the sensor portion and the wire attached portion,
wherein:
the wire attached portion comprises a connection portion connected to the wire network; and
the connection portion is formed by a predetermined electrode pattern such that an opening rate is increased by setting a width of the electrode pattern to be thinner gradually from the wire attached portion toward the wire network.

2. The capacitive touch switch according to claim 1, wherein color of the electrode pattern is set to be the same as a background color.

3. The capacitive touch switch according to claim 1, wherein the opening ratio of the connection portion is increased by setting the width of the electrode pattern to be thinner concentrically toward an outer side with respect to the wire attached portion defined as a center region.

4. The capacitive touch switch according to claim 3, wherein color of the electrode pattern is set to be the same as a background color.

* * * * *